(12) United States Patent
Lin et al.

(10) Patent No.: US 8,319,315 B2
(45) Date of Patent: Nov. 27, 2012

(54) BIPOLAR JUNCTION TRANSISTOR DEVICES

(75) Inventors: Cheng-Chi Lin, Toucheng Township, Yilan County (TW); Wei-Hsun Hsu, Banqiao (TW); Shuo-Lun Tu, Hsin-Chu (TW); Shih-Chin Lien, Sinjhuang (TW); Chin-Pen Yeh, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 189 days.

(21) Appl. No.: 12/847,467

(22) Filed: Jul. 30, 2010

(65) Prior Publication Data
US 2012/0025352 A1   Feb. 2, 2012

(51) Int. Cl.
*H01L 21/02*    (2006.01)
*H01L 29/66*    (2006.01)
(52) U.S. Cl. .................. 257/587; 257/565; 257/E29.174
(58) Field of Classification Search .................. 257/593, 257/565, 578, E29.174, 587, 566, 197
See application file for complete search history.

(56) References Cited

U.S. PATENT DOCUMENTS

| 4,951,108 A * | 8/1990 | Leduc | 257/557 |
| 2007/0034900 A1 * | 2/2007 | Tsai | 257/197 |

* cited by examiner

*Primary Examiner* — A. Sefer
*Assistant Examiner* — Nikolay Yushin
(74) *Attorney, Agent, or Firm* — Alston & Bird LLP (57) ABSTRACT

A bipolar junction transistor (BJT) device including a base region, an emitter region and a collector region comprises a substrate, a deep well region in the substrate, a first well region in the deep well region to serve as the base region, a second well region in the deep well region to serve as the collector region, the second well region and the first well region forming a first junction therebetween, and a first doped region in the first well region to serve as the emitter region, the first doped region and the first well region forming a second junction therebetween, wherein the first doped region includes a first section extending in a first direction and a second section extending in a second direction different from the first direction, the first section and the second section being coupled with each other.

17 Claims, 7 Drawing Sheets

BIPOLAR JUNCTION TRANSISTOR DEVICES

BACKGROUND OF THE INVENTION

The present invention generally relates to a semiconductor device and, more particularly, to a semiconductor bipolar junction transistor (BJT) device with an enhanced beta gain.

In a semiconductor BJT device, by controlling the voltages applied to its base and collector terminals, the device may operate in a forward-active mode. Taking an NPN-type BJT device as an example, i.e., a BJT device with a P-type base region and N-type collector and emitter regions, in operation, a positive voltage $V_{BE}$ and a positive voltage $V_{CE}$ higher than $V_{BE}$ may be applied to the base terminals and the collector terminals, respectively. The emitter-base junction may be therefore forward-biased and the base-collector junction may be therefore reverse-biased, and a base current $I_B$ and a collector current $I_C$ which by definition is $\beta_F$ times the base current $I_B$ may be induced. The BJT device may therefore serve as a current amplifier with a current gain or beta gain $\beta_F$.

Figure 1A:
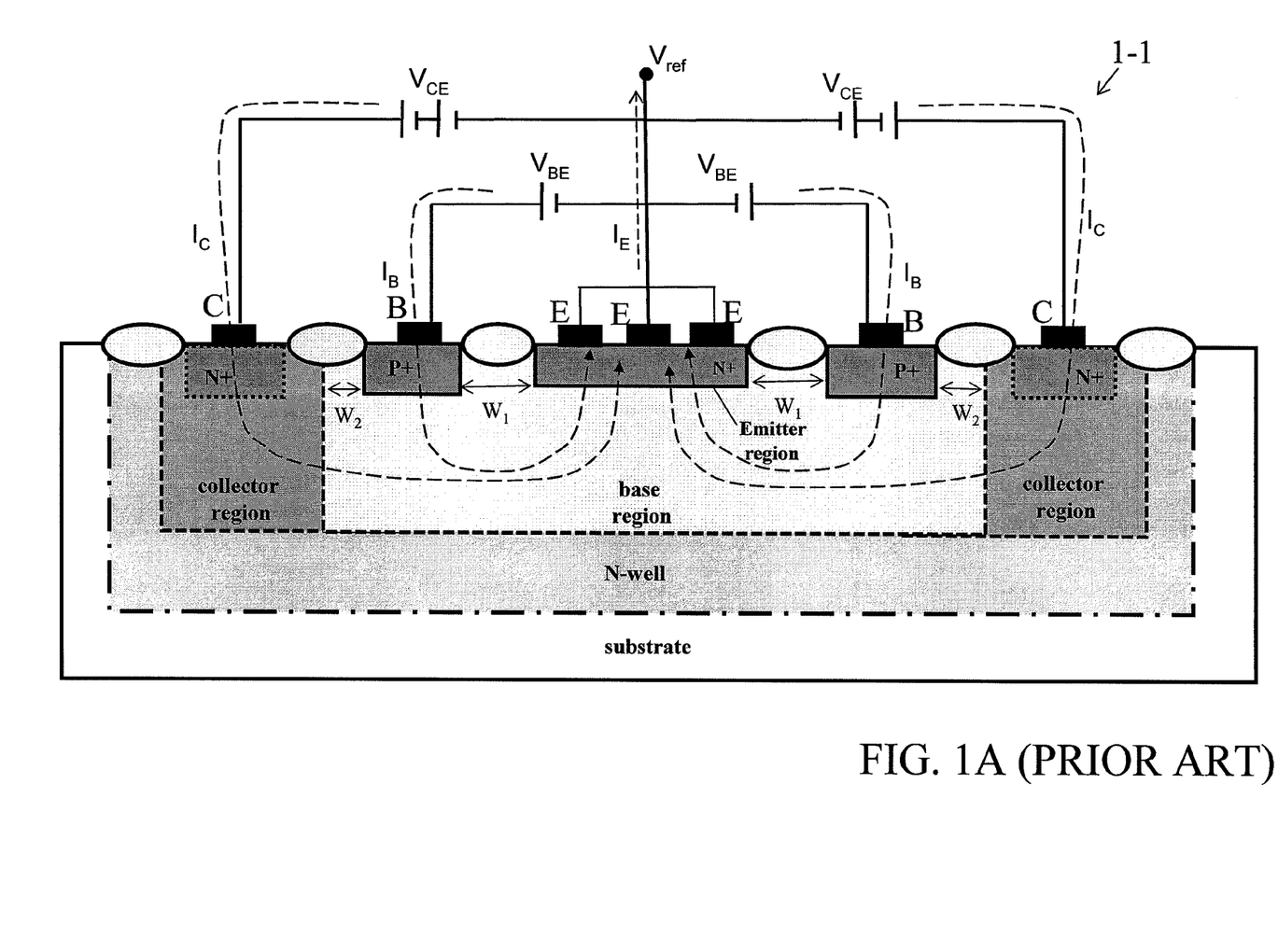
FIG. 1A is a schematic cross-sectional view of a bipolar junction transistor (BJT) device in prior art.

FIG. 1A is a schematic cross-sectional view of a BJT device 1-1 in prior art. Referring to FIG. 1A, the BJT device 1-1 may include base terminals B, emitter terminals E and collector terminals C. When these terminals are appropriately biased, the junction between the base region and the emitter region, i.e., the emitter-base junction, may be forward-biased and the junction between the base region and the collector region, i.e., the base-collector junction, may be reverse-biased. The BJT device 1-1 may therefore operate in a forward-active mode, in which base currents $I_B$ may be induced and flow in a base region from the base terminals B via an emitter region to the emitter terminals E. Meanwhile, collector currents $I_C$ may be also induced and flow in a collector region from the collector terminals C via the base and emitter regions to the emitter terminals E, wherein the collector current $I_C$ is $\beta_F$ times the base current $I_B$. The beta gain $\beta_F$ may be a function of the area of the base region. For example, the current gain $\beta_F$ may be increased as the base area of the BJT device 11-1 is decreased. However, the distance $W_1$ between a P$^+$ region associated with the base terminals and an N$^+$ region associated with the emitter terminals and the distance $W_2$ between the P$^+$ region and the collector-base junction may be subject to a design rule limit.

Figure 1B:
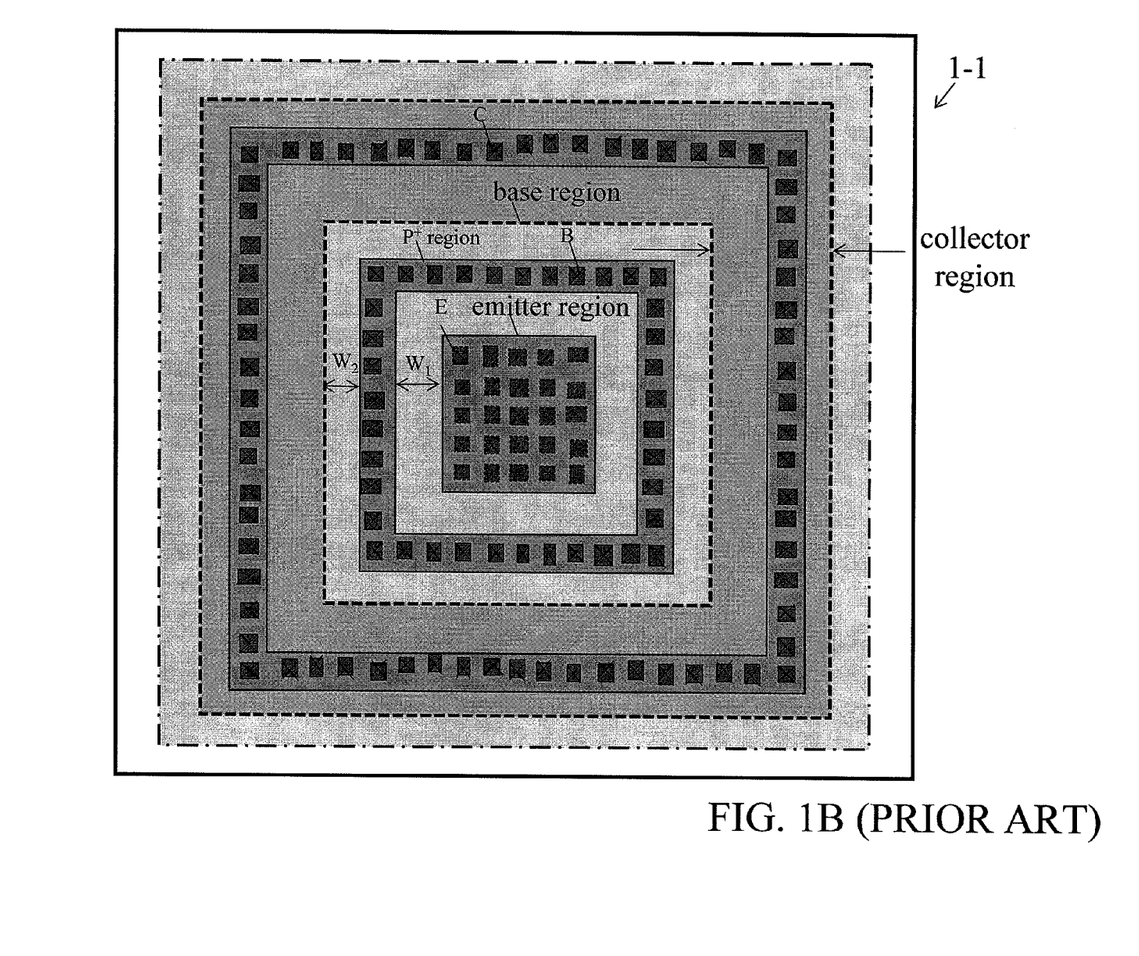
FIG. 1B is a layout of the BJT device illustrated in FIG. 1A.

FIG. 1B is a layout of the BJT device 1-1 illustrated in FIG. 1A. Referring to FIG. 1B, the emitter region, i.e., the N$^+$ region under the emitter terminals E, may be formed in a square pattern and the P$^+$ region under the base terminals B may be formed in a ring pattern. The P$^+$ region may substantially surround the emitter region and may be separated from the emitter region by $W_1$. Furthermore, the P$^+$ region may be separated from the collector-base junction by $W_2$. Due to the limits of $W_1$ and $W_2$, it may be difficult to directly downsize the area of the base region of the BJT device 1-1 in order to increase the beta gain without violating the design rules.

It may therefore be desirable to have a BJT device with a new layout that may achieve a downsized base area and in turn an enhanced beta gain while observing the design rules.

BRIEF SUMMARY OF THE INVENTION

The present invention is directed to a semiconductor bipolar junction transistor (BJT) device with an inventive arrangement of the base, emitter and collector regions thereof.

Examples of the present invention may provide a BJT device including a base region, an emitter region and a collector region. The BIT device may comprise a substrate, a deep well region in the substrate, a first well region in the deep well region to serve as the base region, a second well region in the deep well region to serve as the collector region, the second well region and the first well region forming a first junction therebetween, and a first doped region in the first well region to serve as the emitter region, the first doped region and the first well region forming a second junction therebetween, wherein the first doped region includes a first section extending in a first direction and a second section extending in a second direction different from the first direction, the first section and the second section being coupled with each other.

Some examples of the present invention may provide a BJT device including a base region, an emitter region and a collector region. The BJT device may comprise a substrate, a deep well region in the substrate, a first well region in the deep well region to serve as the base region, a second well region in the deep well region to serve as the collector region, a first doped region in the first well region to serve as the emitter region, at least one second doped region dispersed in the first well region over which at least one base electrode is disposed, and a third doped region in the second well region over which at least one collector electrode is disposed, wherein the at least one second doped region is dispersed between the first doped region and the third doped region.

Examples of the present invention may also provide a BJT device including a base region, an emitter region and a collector region. The BJT device may comprise a substrate, a deep well region in the substrate, a first well region in the deep well region to serve as the base region, a second well region in the deep well region to serve as the collector region, a first doped region in the first well region to serve as the emitter region, the first doped region including a first section extending in a first direction and a second section extending in a second direction different from the first direction, the first section and the second section being coupled with each other, and at least one second doped region dispersed in the first well region, wherein the at least one second doped region is separated by the first section and the second section of the first doped region.

Additional features and advantages of the present invention will be set forth in portion in the description which follows, and in portion will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, examples are shown in the drawings. It should be understood, however, that the invention is not limited to the precise arrangements and instrumentalities shown in the examples.

In the drawings.

DETAILED DESCRIPTION OF THE INVENTION

Reference will now be made in detail to the present examples of the invention illustrated in the accompanying drawings. Wherever possible, the same reference numbers will be used throughout the drawings to refer to the same or like portions. It should be noted that the drawings are in greatly simplified form and are not to precise scale.

Figure 2A:
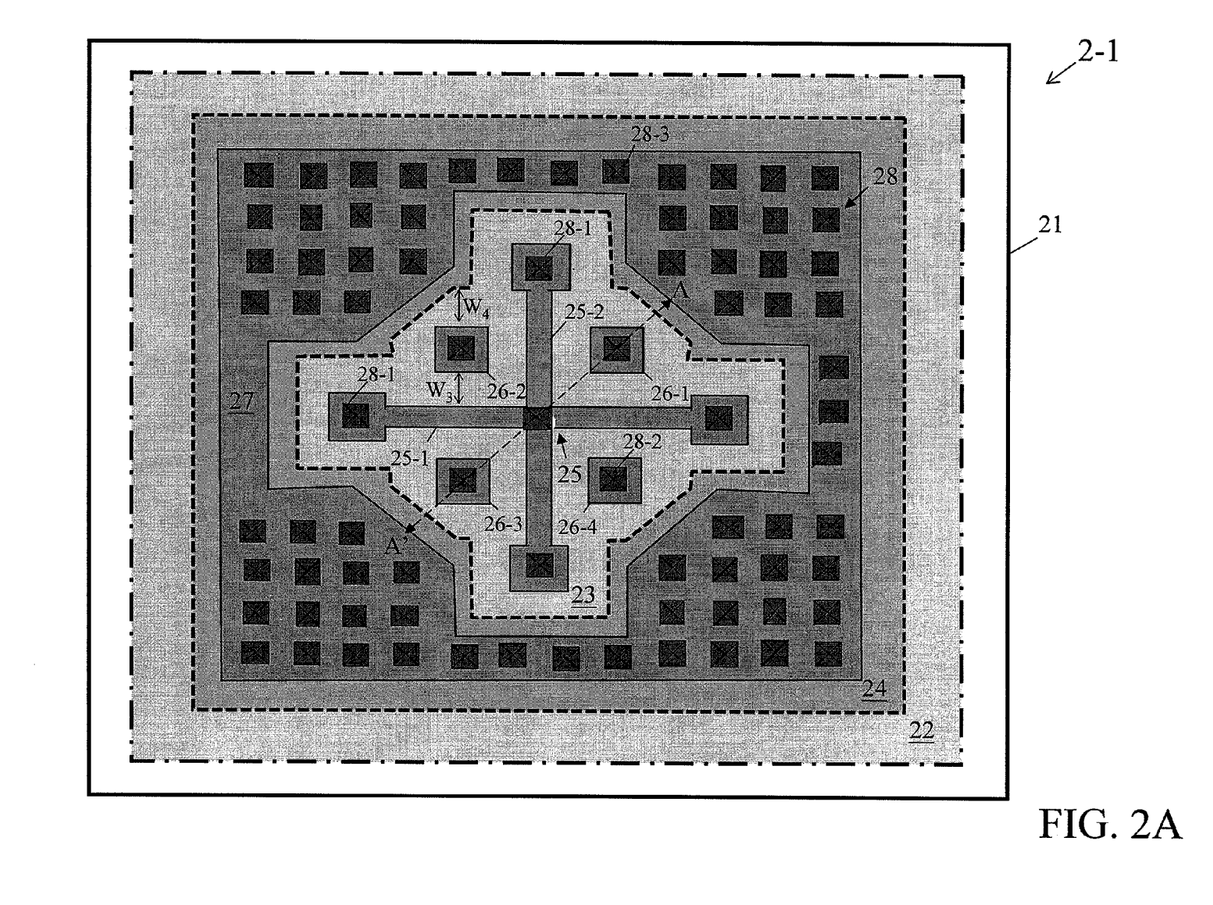
FIG. 2A is a layout of a BJT device in accordance with an example of the present invention.

FIG. 2A is a layout of a bipolar junction transistor (BJT) device 2-1 in accordance with an example of the present invention. Referring to FIG. 2A, the BJT device 2-1 may include a substrate 21, a deep well region 22, a first well region 23, a second well region 24, a first doped region 25, second doped regions 26-1 to 26-4, a third doped region 27 and a patterned conductive layer 28.

The first doped region 25 may serve as an emitter region for the BJT device 2-1. Unlike the emitter region of the BJT device 1-1 illustrated in FIG. 1B that takes the form of a square or rectangular pattern, the first doped region 25 may further include a first section 25-1 and a second section 25-2, which may intersect each other in substantially a cross pattern. Specifically, the first section 25-1 may extend in a first direction and the second section 25-2 may extend in a second direction substantially orthogonal to the first direction. Moreover, the patterned conductive layer 28 may include contacts 28-1 over the first doped region 25, which may serve as emitter electrodes for the first doped region 25, i.e., the emitter region.

The first well region 23 may serve as a base region for the BJT device 2-1. In the first well region 23, the second doped regions 26-1 to 26-4 may be separated from one another by the first section 25-1 and the second section 25-2 of the first doped region 25. Furthermore, each of the second doped regions 26-1 to 26-4 may be disposed in a quadrant defined by the first and the second sections 25-1 and 25-2 of the first doped region 25 and may be arranged to space apart from one of the first section 25-1 and second section 25-2 by a suitable distance in conformity with design rules. Moreover, the patterned conductive layer 28 may include contacts 28-2 over the second doped regions 26-1 to 26-4, which may serve as base electrodes for the first well region 23, i.e., the base region.

The first doped region 25 and the second doped regions 26-1 to 26-4 may be formed in the first well region 23 and substantially surrounded by the third doped region 27. Furthermore, the first well region 23 and the second well region 24 may be formed in the deep well region 22, and the first well region 23 may be substantially surrounded by the second well region 24. Moreover, the second well region 24 may serve as a collector region for the BJT device 2-1. The patterned conductive layer 28 may include contacts 28-3 over the third doped region 27, which may serve as collector electrodes for the second well region 27, i.e., the collector region.

Referring back to FIG. 1B, the emitter doped region associated with the emitter electrodes "E" is surrounded by the base doped region (P$^+$ region) associated with the base electrodes "B", which in turn is surrounded by the collector doped region associated with the collector electrodes "C". Unlike the arrangement illustrated in FIG. 1B, in the present example according to the present invention, the second doped regions 26-1 to 26-4 (over which the base electrodes 28-2 may be disposed) are dispersed in the first well region 23 so that the first doped region 25 (over which the emitter electrodes 28-1 may be disposed) is not surrounded by the second doped regions 26-1 to 26-4. Specifically, in the present example, the second doped regions 26-1 to 26-4 may be dispersed around the first doped region 25.

Figure 2B:
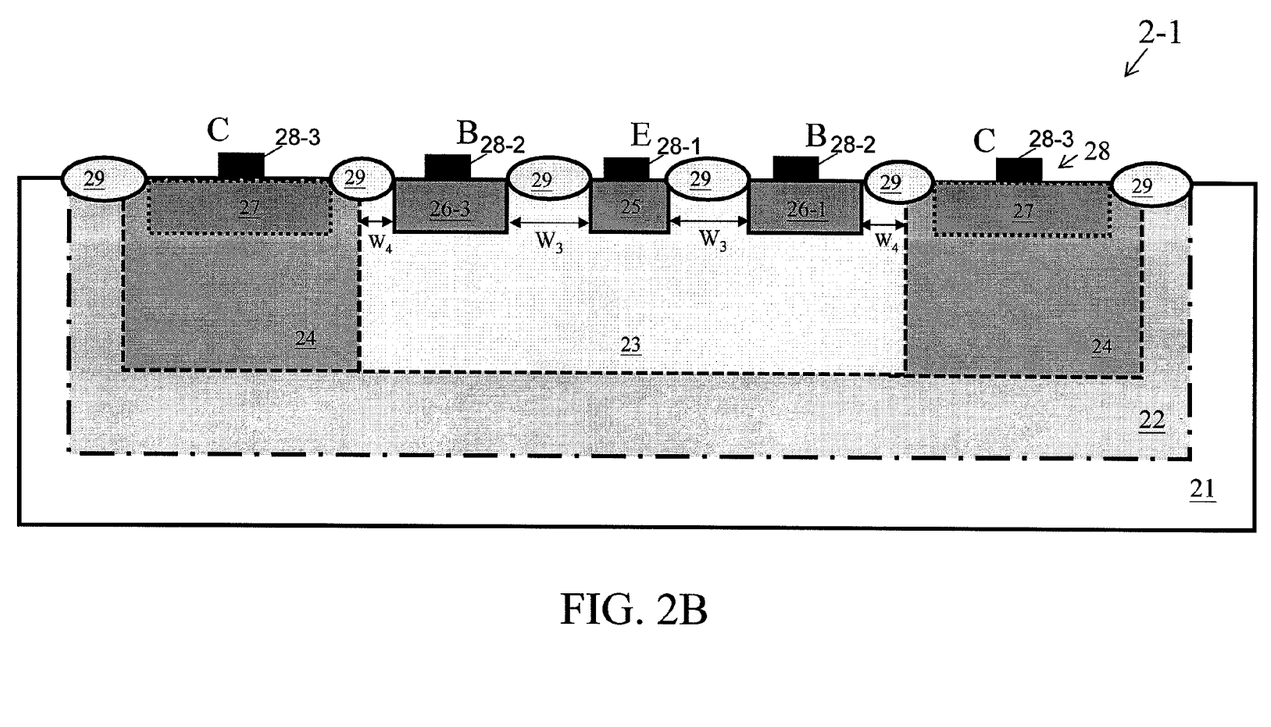
FIG. 2B is a schematic cross-sectional view of the BJT device illustrated in FIG. 2A taken along a line corresponding to line AA'.

FIG. 2B is a cross-sectional view of the BJT device 2-1 illustrated in FIG. 2A taken along a line corresponding to line AA'.

Referring to FIG. 2B, isolation structures 29 such as field oxide (FOX) may be disposed at desired locations to provide electrical isolation in the BJT device 2-1. The substrate 21 of the BJT device 2-1 may include a first-type impurity, such as P-type impurity. The deep well region 22, which may include a second-type impurity, such as N-type impurity, may be formed in a portion of the substrate 21. Furthermore, the patterned second well region 24, which may include the second-type impurity, may be formed in the deep well region 22. The first well region 23, which may include the first-type impurity, may also be formed in the deep well region 22. Moreover, the second doped regions 26-1 to 26-4 may include the first-type impurity while the first doped region 25 and the third doped region 27 may include the second-type impurity, resulting in an npn-type BJT device 2-1, where a first junction (base-emitter junction) may exist between the first well region 23 and the first doped region 25, and a second junction (base-collector junction) may exist between the first well region 23 and the second well region 24, To comply with the design rules of the semiconductor process for manufacturing the BJT device 2-1, the distance $W_3$ between the first doped region 25 and the second doped regions 26-1 to 26-4 in terms of mask may not be less than a lower limit. For example, $W_3$ may not be less than 0.9 um given a 0.5-um complementary metal-oxide-semiconductor (CMOS) process. Moreover, the distance $W_4$ between the second doped regions 26-1 to 26-4 and the junction associated with the first well region 23 and the second well region 24 may not be less than another lower limit so as to comply with the above-mentioned design rules. For example, $W_4$ may not be less than 0.3 um given the 0.5-um CMOS process.

Referring back to FIG. 1B, a single base doped region (P$^+$ region) may be disposed between the base-emitter junction and the base-collector junction. Unlike the arrangement illustrated in FIG. 1B, in the present example, a number of second doped regions 26-1 to 26-4 may be disposed between the base-emitter junction and the base-collector junction.

Figure 3A:
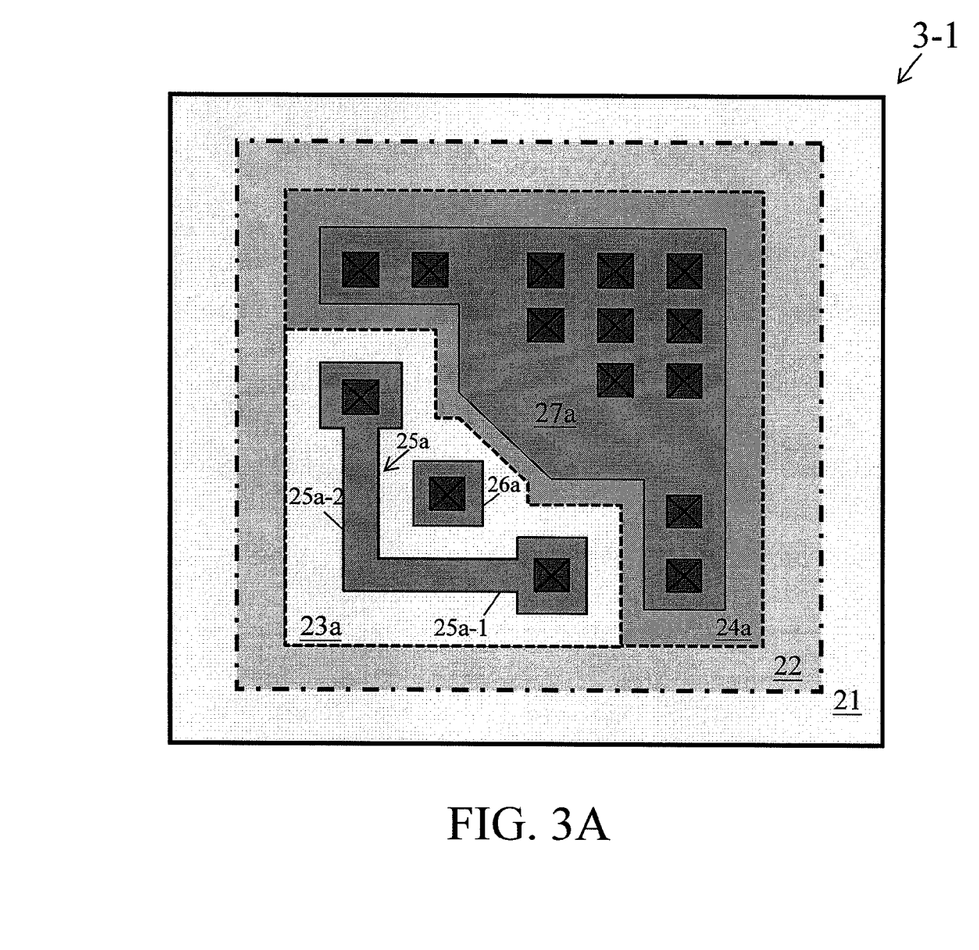
FIG. 3A is a layout of a BJT device in accordance with another example of the present invention.

FIG. 3A is a layout of a BJT device 3-1 in accordance with another example of the present invention. Referring to FIG. 3A, the BJT device 3-1 may be similar to a quarter of the BJT device 2-1 described and illustrated in FIG. 2A.

Specifically, the BJT device 3-1 may include in the deep well region 22 a first well region 23a and a second well region 24a. The first well region 23a and the second well region 24a may serve as a base region and a collector region for the BJT device 3-1, respectively. A base-collector junction may exist between the first well region 23a and the second well region 24a. Furthermore, the BJT device 3-1 may include a first doped region 25a in the first well region 23a. The first doped region 25a may serve as an emitter region for the BJT device 3-1. A base-emitter junction may exist between the first well region 23a and the first doped region 25a.

The first doped region 25a may include a first section 25a-1 and a second section 25a-2 coupled to each other. In one example according to the present invention, the first section 25a-1 may extend in a first direction and the second section 25a-2 may extend in a second direction different from the first direction. In another example, the first section 25a-1 may extend in a first direction and the second section 25a-2 may extend in a second direction substantially orthogonal to the first direction. Furthermore, one or more second doped region 26a may be dispersed in the first well region 23a substantially between the first doped region 25a and a third doped region 27a. The at least one second doped region 26a may be spaced apart from one of the first section 25a-1 and second section 25a-2 by a suitable distance in conformity with design rules. Moreover, the first doped region 25a is not surrounded by the at least one second doped region 26a.

Figure 3B:
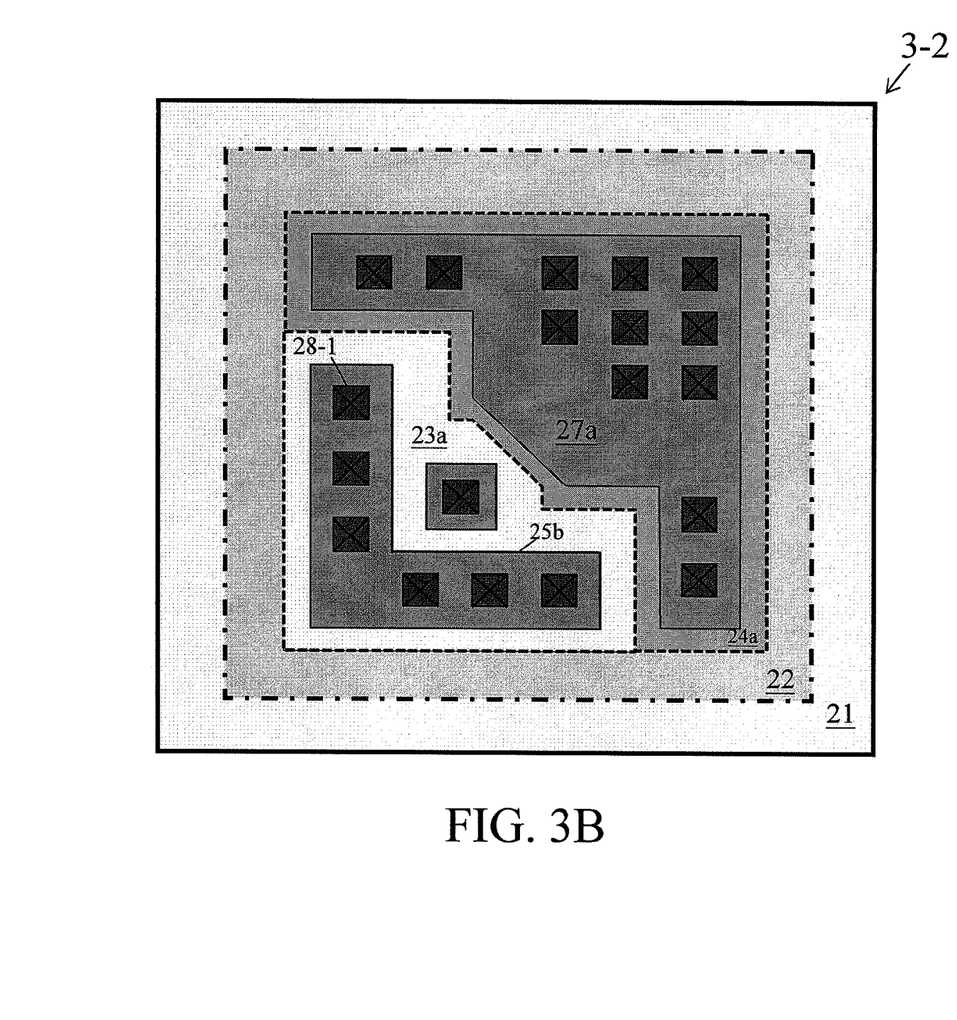
FIG. 3B is a layout of a BJT device in accordance with still another example of the present invention.

FIG. 3B is a layout of a BJT device 3-2 in accordance with still another example of the present invention. Referring to FIG. 3B, the BJT device 3-2 may be similar to the BJT device 3-1 illustrated in FIG. 5A except that, for example, the first doped region 25b of the BJT device 3-2 may have a substantially uniform width, which may allow more contacts 28-1 to be disposed thereon.

Figure 3C:
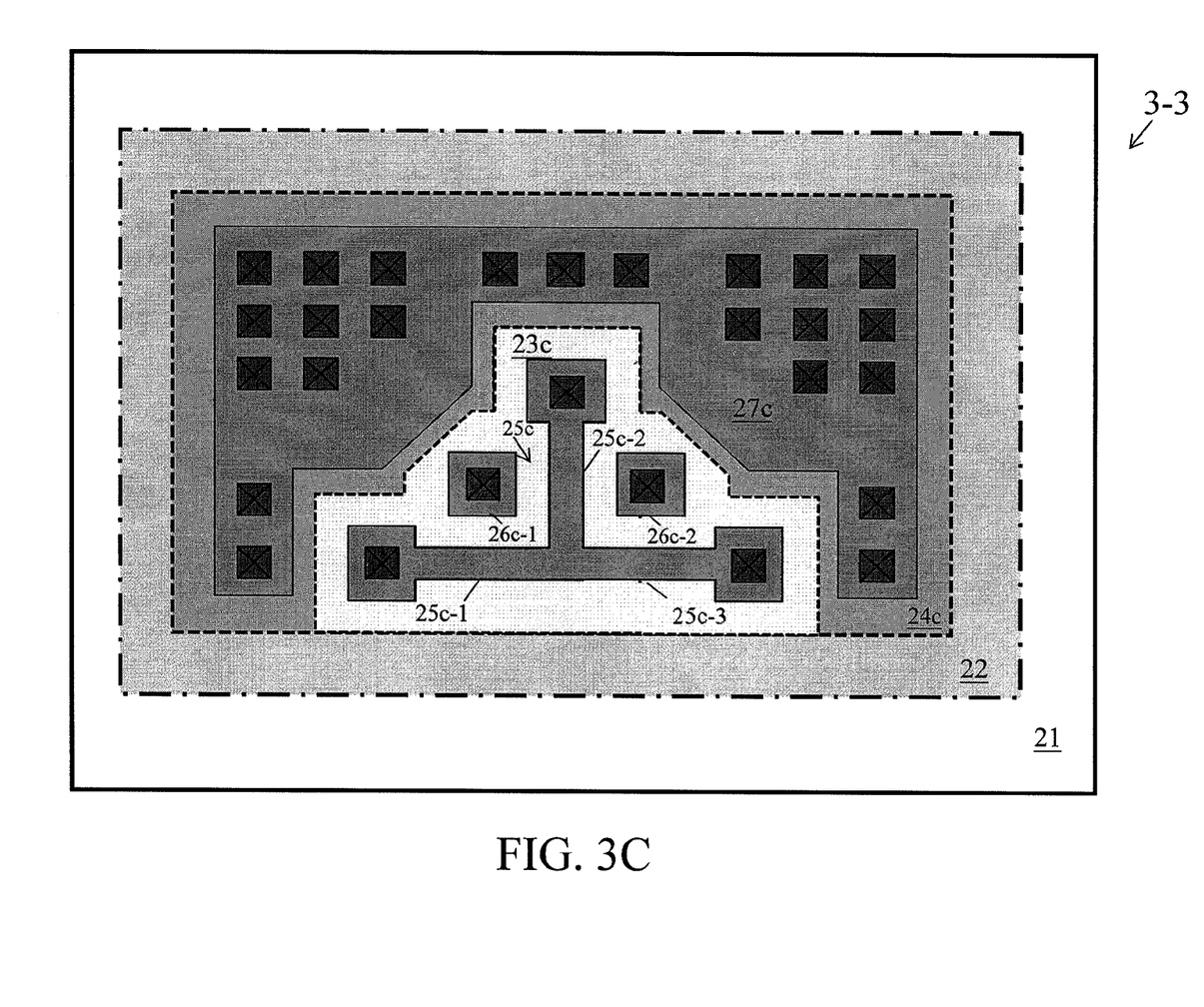
FIG. 3C is a layout of a BJT device in accordance with yet another example of the present invention.

FIG. 3C is a layout of a BJT device 3-3 in accordance with yet another example of the present invention. Referring to FIG. 3C, the BJT device 3-3 may be similar to a half of the BJT device 2-1 illustrated in FIG. 2A. Specifically, the BJT device 3-3 may include in the deep well region 22 a first well region 23c and a second well region 24c. The first well region 23c and the second well region 24c may serve as a base region and a collector region for the BJT device 3-3, respectively. A base-collector junction may exist between the first well region 23c and the second well region 24c. Furthermore, the BJT device 3-3 may include a first doped region 25c in the first well region 23c. The first doped region 25c may serve as an emitter region for the BJT device 3-3. A base-emitter junction may exist between the first well region 23c and the first doped region 25c.

The first doped region 25c may include a first section 25c-1, a second section 25c-2 and a third section 25c-3 coupled to one another. In one example according to the present invention, the first section 25c-1, the second section 25c-2 and the third section 25c-3 may extend in a first direction, a second direction and a third direction, respectively, which may be different from one another. In another example, the first section 25c-1 and the third section 25c-3 may extend in a first direction and the second section 25c-2 may extend in a second direction substantially orthogonal to the first direction. Furthermore, second doped regions 26c-1 and 26c-2 may be dispersed in the first well region 23c, wherein one or more second doped region 26c-1 may be substantially disposed between the first and third sections 25c-1, 25c-3 and a third doped region 27c, and one or more second doped region 26c-2 may be substantially disposed between the second and third sections 25c-2, 25c-3 and the third doped region 27c. The second doped regions 26c-1 and 26c-2 may be spaced apart from one of the first section 25c-1, second section 25c-2 and third section 25c-3 by a suitable distance in conformity with design rules. Moreover, the first doped region 25c is not surrounded by the second doped regions 26c-1 and 26c-2.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

We claim:
1. A bipolar junction transistor (BJT) device including a base region, an emitter region and a collector region, the BJT device comprising:
a substrate;
a deep well region in the substrate;
a first well region in the deep well region to serve as the base region;
a second well region in the deep well region to serve as the collector region, the second well region and the first well region forming a first junction therebetween;
a first doped region in the first well region to serve as the emitter region, the first doped region and the first well region forming a second junction therebetween;
at least one second doped region dispersed in the first well region; and
a third doped region in the second well region,
wherein the first doped region includes a first section extending in a first direction and a second section extending in a second direction different from the first direction, the first section and the second section being coupled with each other, and
wherein the at least one second doped region includes doped regions separated by the first section and the second section of the first doped region.

2. The BJT device of claim 1, wherein the first section and the second section intersect each other in a cross pattern.

3. The BJT device of claim 1, wherein the first doped region further includes a third section coupled to the first section and the second section, the third section extending in a third direction different from the first direction and the second direction.

4. The BJT device of claim 1, wherein the first doped region further includes a third section coupled to the first section and the second section, the third section extending in one of the first direction and the second direction.

5. The BJT device of claim 1, wherein the at least one second doped region is dispersed around the first doped region.

6. The BJT device of claim 1, wherein the first doped region further includes a third section and wherein the at least one second doped region includes doped regions separated by the first section, the second section and the third section of the first doped region.

7. A bipolar junction transistor (BJT) device including a base region, an emitter region and a collector region, the BJT device comprising:
a substrate;
a deep well region in the substrate;
a first well region in the deep well region to serve as the base region;
a second well region in the deep well region to serve as the collector region;
a first doped region in the first well region to serve as the emitter region;
at least one second doped region dispersed in the first well region over which at least one base electrode is disposed; and
a third doped region in the second well region over which at least one collector electrode is disposed;
wherein the at least one second doped region is dispersed between the first doped region and the third doped region, and
wherein the at least one second doped region includes doped regions separated by the first section and the second section of the first doped region.

8. The BJT device of claim 7, wherein the first doped region further includes a third section and wherein the at least one second doped region includes doped regions separated by the first section, the second section and the third section of the first doped region.

9. The BJT device of claim 7, wherein the first doped region includes a first section extending in a first direction and a second section extending in a second direction different from the first direction, the first section and the second section being coupled with each other.

10. The BJT device of claim 9, wherein the first section and the second section intersect each other in a cross pattern.

11. The BJT device of claim 9, wherein the first doped region further includes a third section coupled to the first section and the second section, the third section extending in a third direction different from the first direction and the second direction.

12. The BJT device of claim 9, wherein the first doped region further includes a third section coupled to the first section and the second section, the third section extending in one of the first direction and the second direction.

13. A bipolar junction transistor (BJT) device including a base region, an emitter region and a collector region, the BJT device comprising:
   a substrate;
   a deep well region in the substrate;
   a first well region in the deep well region to serve as the base region;
   a second well region in the deep well region to serve as the collector region;
   a first doped region in the first well region to serve as the emitter region, the first doped region including a first section extending in a first direction and a second section extending in a second direction different from the first direction, the first section and the second section being coupled with each other; and
   at least one second doped region dispersed in the first well region,
   wherein the at least one second doped region is separated by the first section and the second section of the first doped region.

14. The BJT device of claim 13, wherein the first section and the second section intersect each other in a cross pattern.

15. The BJT device of claim 13, wherein the first doped region further includes a third section coupled to the first section and the second section, the third section extending in a third direction different from the first direction and the second direction.

16. The BJT device of claim 13, wherein the first doped region further includes a third section coupled to the first section and the second section, the third section extending in one of the first direction and the second direction.

17. The BJT device of claim 13 further comprising a third doped region in the second well region, wherein the at least one second doped region is dispersed between the first doped region and the third doped region.

* * * * *

UNITED STATES PATENT AND TRADEMARK OFFICE
CERTIFICATE OF CORRECTION

PATENT NO.         : 8,319,315 B2
APPLICATION NO.    : 12/847467
DATED              : November 27, 2012
INVENTOR(S)        : Lin et al.

Page 1 of 1

It is certified that error appears in the above-identified patent and that said Letters Patent is hereby corrected as shown below:

In the Specifications:

Column 1,
Line 67, "BIT" should read --BJT--.

Signed and Sealed this
Fourteenth Day of May, 2013

Teresa Stanek Rea
*Acting Director of the United States Patent and Trademark Office*